(12) United States Patent
Jung et al.

(10) Patent No.: US 11,637,168 B2
(45) Date of Patent: Apr. 25, 2023

(54) DISPLAY DEVICE

(71) Applicant: LG Display Co., Ltd., Seoul (KR)

(72) Inventors: Kyoung June Jung, Paju-si (KR); Jeong Jae Ban, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 188 days.

(21) Appl. No.: 17/134,244

(22) Filed: Dec. 25, 2020

(65) Prior Publication Data
US 2021/0202666 A1 Jul. 1, 2021

(30) Foreign Application Priority Data
Dec. 27, 2019 (KR) .................. 10-2019-0176438

(51) Int. Cl.
*H01L 27/32* (2006.01)
(52) U.S. Cl.
CPC ...... *H01L 27/3276* (2013.01); *H01L 27/3234* (2013.01); *H01L 27/3272* (2013.01)

(58) Field of Classification Search
CPC .......... G09G 3/3225; G09G 2300/0426; H01L 27/3234; H01L 27/3258; H01L 27/3265; H01L 27/3272; H01L 27/3276
See application file for complete search history.

(56) References Cited

U.S. PATENT DOCUMENTS

| | | | |
|---|---|---|---|
| 2017/0235200 A1* | 8/2017 | Chong | H01L 29/78633 257/59 |
| 2019/0392767 A1* | 12/2019 | Kim | G09G 3/20 |
| 2020/0098843 A1* | 3/2020 | Jeon | H01L 27/3258 |
| 2020/0176539 A1* | 6/2020 | Sung | G09G 3/3233 |

\* cited by examiner

*Primary Examiner* — Kevin M Nguyen
(74) *Attorney, Agent, or Firm* — Polsinelli PC

(57) ABSTRACT

A display device includes an opening area formed in a display area and a non-display area surrounding the opening area, wherein the display area includes a plurality of pixels and a plurality of lines connected to the plurality of pixels, the non-display area includes a connection member connected to at least one of the plurality of lines of the display area, and the connection member is disposed in a different layer from the connected line and is electrically connected to the line by a via-electrode.

19 Claims, 7 Drawing Sheets

DISPLAY DEVICE

CROSS REFERENCE TO RELATED APPLICATION

This application claims priority to and the benefit of Korean Patent Application No. 10-2019-0176438, filed on Dec. 27, 2019, which is hereby incorporated by reference in its entirety.

BACKGROUND

Field of the Disclosure

The present disclosure relates to a display device.

Description of the Background

Display devices are variously applied not only to TVs or monitors but also to personal portable electronic devices such as a mobile phone and a personal digital assistant (PDA) and such display devices are equipped with a camera to implement a camera function and a video call function.

Display devices tend to be manufactured to have a light and thin shape and also a wide display area. Accordingly, forming a bezel area, which is a non-display area excluding a display area, to be as small as possible is required.

Recently, a structure has been disclosed in which an opening area through which light enters a front camera is disposed inside a display area. Therefore, it is necessary to make a bezel area which is disposed around the opening area as small as possible.

SUMMARY

Accordingly, the present disclosure is to provide a display device in which a bezel area surrounding an opening area is reduced.

The present disclosure also provides a display device with a high degree of design freedom by reducing parasitic capacitance generated between lines in a bezel area surrounding an opening area.

Problems to be solved in the present disclosure are not limited thereto and include the following technical solutions and also objectives or effects understandable from the present disclosure.

According to an aspect of the present disclosure, there is provided a display device including an opening area formed in a display area and a non-display area surrounding the opening area, wherein the display area includes a plurality of pixels and a plurality of lines connected to the plurality of pixels, the non-display area includes a connection member connected to at least one of the plurality of lines of the display area, and the connection member is disposed in a different layer from the connected line and is electrically connected to the line by a via-electrode.

The connection member may be disposed in a lower layer than the connected line.

The connection member may be disposed in a higher layer than the connected line.

The pixel may include a transistor, the transistor may include a beam shielding member disposed on a substrate; a semiconductor pattern disposed on the beam shielding member; and a gate electrode disposed on the semiconductor pattern, the line connected to the connection member among the plurality of lines may be a gate line or an emission line, and the connection member may be disposed in the same layer as the beam shielding member.

The transistor may further include a first insulating layer disposed between the beam shielding member and the semiconductor pattern; and a second insulating layer disposed between the semiconductor pattern and the gate electrode, and the via-electrode may pass through the first insulating layer and the second insulating layer in the non-display area to electrically connect the gate line or the emission line to the connection member.

The connection member may be electrically insulated from the beam shielding member, and the connection member may have the same composition and thickness as the beam shielding member.

The gate electrode in the display area may be electrically connected to the beam shielding member through the first insulating layer and the second insulating layer.

The plurality of lines in the non-display area may overlap vertically.

The line electrically connected to the connection member may be an emission line.

The pixel may include a transistor, the transistor may include a beam shielding member disposed on a substrate; a semiconductor pattern disposed on the beam shielding member; a gate electrode disposed on the semiconductor pattern; a source electrode and a drain electrode disposed on the gate electrode; and a pixel electrode disposed on the gate electrode, the line connected to the connection member among the plurality of lines may be a gate line or an emission line, and the connection member may be disposed in the same layer as the pixel electrode.

The via-electrode may pass through an insulating layer between the gate electrode and the pixel electrode in the non-display area to electrically connect the gate line or the emission line to the connection member.

The connection member may be electrically insulated from the pixel electrode, and the connection member may have the same composition and thickness as the pixel electrode.

According to another aspect of the present disclosure, there is provided a display device including a substrate having an opening area formed in a display area and a non-display area surrounding the opening area; a gate line extending through the display area and the non-display area; and an emission line disposed in a different layer from the gate line in the non-display area, wherein the emission line is disposed at a location where parasitic capacitance between the emission line and the gate line is minimized in the non-display area.

The emission line may be disposed in a layer in which the parasitic capacitance between the emission line and the gate line is smallest in the non-display area.

The emission line may be disposed in the same layer as the gate line in the display area.

The display device may further include a via-electrode configured to connect emission lines disposed in different layers in the display area and the non-display area.

A width by which the emission line and the gate line overlap in the non-display area may be greater than or equal to 50% of a width of the emission line.

An insulating layer between the emission line and the gate line in the non-display area may have a thickness of 3000 Å or greater.

BRIEF DESCRIPTION OF THE DRAWINGS

The above features and advantages of the present disclosure will become more apparent to those of ordinary skill in the art by describing exemplary aspects thereof in detail with reference to the attached drawings, in which.

DETAILED DESCRIPTION

The following aspects may be modified or combined with each other, and the scope of the present disclosure is not limited to the aspects.

Details described in a specific aspect may be understood as descriptions associated with other aspects unless otherwise stated or contradicted even if there is no description thereof in the other aspects.

For example, when features of element A are described in a specific aspect and features of element B are described in another aspect, an aspect in which element A and element B are combined with each other should be understood as falling within the scope of the present disclosure unless otherwise stated or contradicted even if not explicitly stated.

In the descriptions of aspects, when an element is referred to as being above or under another element, the two elements may be in direct contact with each other, or one or more other elements may be disposed between the two elements. In addition, the term "above or below" used herein may represent a downward direction in addition to an upward direction with respect to one element.

Switch elements in a gate driving circuit of the present disclosure may be implemented as a transistor in an n-type or p-type metal-oxide-semiconductor field-effect transistor (MOSFET) structure. It should be noted that although an n-type transistor is illustrated in the following aspects, the present disclosure is not limited thereto.

A transistor is a three-electrode element including a gate, a source, and a drain. The source is an electrode through which carriers are supplied to the transistor. In the transistor, carriers begin to flow from the source. The drain is an electrode through which carriers exit the transistor. That is, the flow of carriers in the MOSFET is from the source to the drain.

In the case of an n-type MOSFET (NMOS), the carriers are electrons. Thus, the source voltage is lower than the drain voltage so that the electrons may flow from the source to the drain.

In an n-type MOSFET, current flows from the drain to the source because the electrons flow from the source to the drain. In the case of a p-type MOSFET (PMOS), the carriers are holes. Thus, the source voltage is higher than the drain voltage so that the holes may flow from the source to the drain. Since the holes in the p-type MOSFET flow from the source to the drain, current flows from the source to the drain. It should be noted that the source and drain of the MOSFET are not fixed. For example, the source and drain of the MOSFET may be changed according to an applied voltage. Accordingly, in the following aspects, the present disclosure is not limited by the source and drain of the transistor.

In an aspect of the present disclosure, transistors constituting a pixel are all implemented in the p-type, but the technical spirit of the present disclosure is not limited thereto and may be applied even when the transistors are implemented in the n-type.

Figure 1:
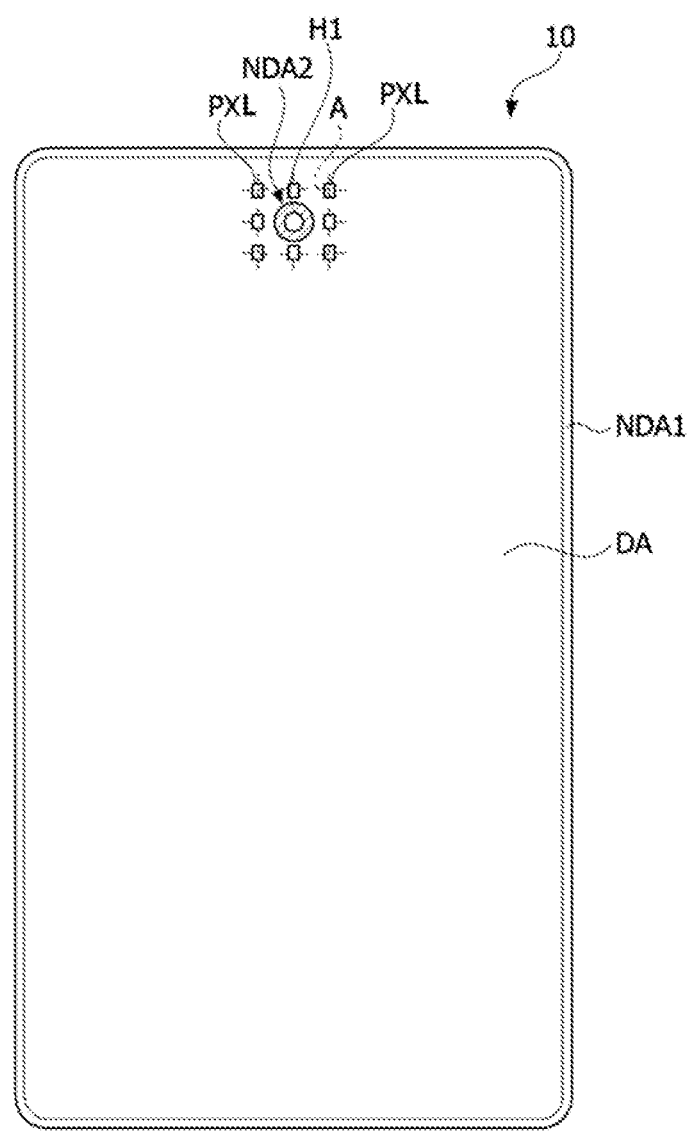
FIG. 1 is a conceptual diagram of a display device according to an aspect of the present disclosure.
Figure 2:
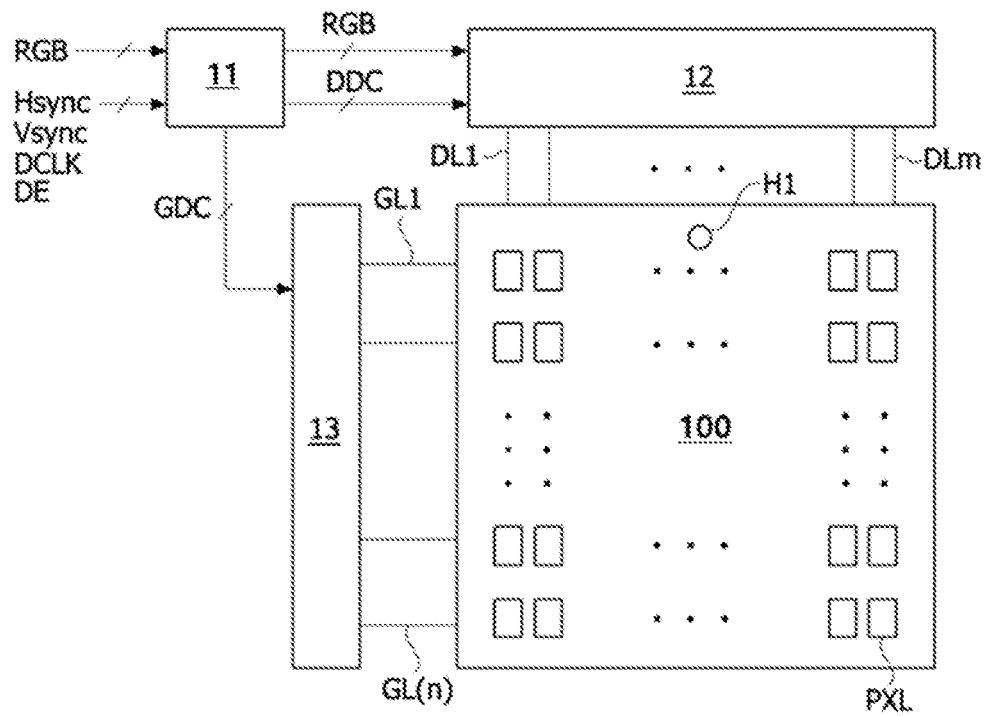
FIG. 2 is a diagram illustrating the operation of a display device.
Figure 3:
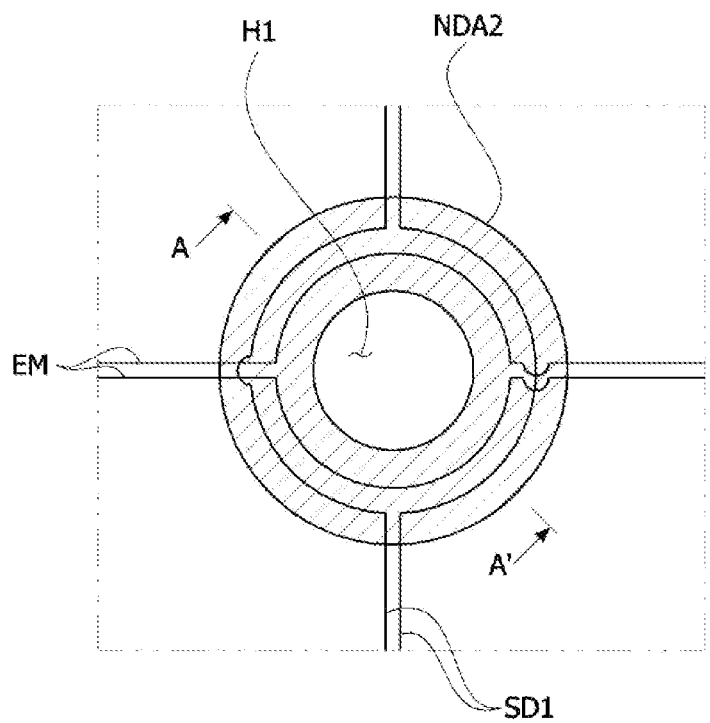
FIG. 3 is an enlarged view of part A of FIG. 1.
Figure 4:
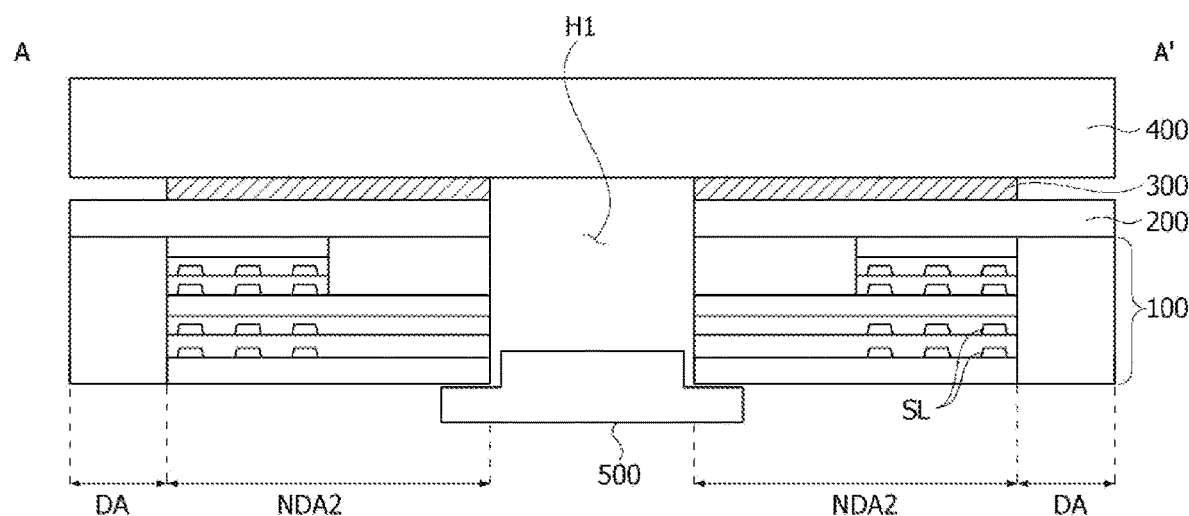
FIG. 4 is a cross-sectional view taken along A-A' of FIG. 3.

FIG. 1 is a conceptual diagram of a display device according to an aspect of the present disclosure, FIG. 2 is a diagram illustrating the operation of a display device, FIG. 3 is an enlarged view of a part A of FIG. 1, and FIG. 4 is a cross-sectional view taken along A-A' of FIG. 3.

Referring to FIG. 1, the display device according to an aspect may include a display area DA, a non-display area NDA1 disposed on the outermost side, an opening area H1 formed in the display area DA, and a non-display area NDA2 surrounding the opening area H1.

The opening area H1 may be an area through which light enters the front camera. However, the present disclosure is not limited thereto, and the opening area H1 may be an area for various electronic devices to function. The shape and number of opening areas H1 may be variously modified as necessary.

Referring to FIG. 2, the display device according to an aspect of the present disclosure may include a display panel 100 where pixels PXL are formed, a data driving unit 12 for driving data lines DL1 to DLm, a gate driving unit 13 for driving gate lines GL1 to GL[n], and a timing controller 11 for controlling the driving timing of the data driving unit 12 and the gate driving unit 13.

A plurality of pixels PXL may be arranged in the display panel 100 in a matrix form. Pixels PXL arranged in an nth horizontal line may be connected to an nth gate line GL[n]. The nth gate line GL[n] may include an nth scan line SL[n] and an (n−1)th scan line SL[n−1]. The pixels PXL arranged in each column line may be connected to one data line DL.

The pixels PXL may be supplied in common with high-potential and low-potential driving voltages ELVDD and ELVSS and an initialization voltage Vini from a power generation unit (not shown). The initialization voltage may be selected within a voltage range sufficiently lower than the operating voltage of an organic light-emitting device (OLED) to prevent unnecessary light emission of the OLED during an initial period and a sampling period.

Transistors TFT constituting a pixel PXL may be implemented as a transistor including an oxide semiconductor layer. The oxide semiconductor layer is advantageous for increasing the size of the display panel 100 in consideration of electron mobility, process variation, and the like. The oxide semiconductor layer may be formed of an oxide semiconductor, which includes, but is not limited to, indium tin oxide (ITO), indium zinc oxide (IZO), indium tin zinc oxide (ITZO), indium gallium zinc oxide (IGZO), or the like. Also, the present disclosure is not limited thereto, and the semiconductor layer of the transistor may be formed of amorphous silicon (a-Si), polycrystalline silicon (poly-Si), an organic semiconductor, or the like.

The timing controller 11 may rearrange digital video data RGB input from the outside according to the resolution of the display panel 100 and supply the rearranged digital video data to the data driving unit 12. Also, the timing controller 11 may generate a data control signal DDC for controlling the operation timing of the data driving unit 12 and a gate control signal GDC for controlling the operation timing of the gate driving unit 13 on the basis of timing signals such as a vertical synchronization signal Vsync, a horizontal synchronization signal Hsync, a dot clock signal DCLK, and a data enable signal DE.

The data driving unit 12 may convert the digital video data RGB input from the timing controller 11 into an analog data voltage on the basis of the data control signal DDC.

The gate driving unit 13 may generate a scan signal and an emission signal (light-emission control signal) on the basis of the gate control signal GDC. The gate driving unit 13 may include a scan driving unit and an emission driving unit. Hereinafter, it is defined that the scan signal is supplied through a gate line and the emission signal is supplied through an emission line.

The scan driving unit may generate first to nth scan signals SCAN1 to SCAN[n], and the emission driving unit may generate first to nth light emission control signals EM1 to EM[n]. The gate driving unit 13 may be directly formed on the non-display area of the display panel 100 according to Gate-driver In Panel (GIP).

Referring to FIG. 3, a plurality of lines may be disposed in the non-display area NDA2 surrounding the opening area H1. For example, a plurality of data lines SD1, a plurality of gate lines, and a plurality of emission lines EM may be disposed in the non-display area NDA2. The plurality of data lines, the plurality of gate lines, and the plurality of emission lines may be formed with a curvature along the opening area H1 in the non-display area NDA2.

In the drawing, for convenience of description, the data lines SD1 and the emission lines EM are shown as not overlapping. In the following description, however, the plurality of lines may be arranged to vertically overlap each other. Therefore, the size of the non-display area NDA2 may be reduced.

Referring to FIG. 4, the display device according to an aspect may include a display panel 100, a touch panel 200, a black matrix 300 disposed in a non-display area, and a window 400. An opening area H1 may be vertically formed in the display panel 100, and a camera module 500 may be disposed under the display panel 100.

The non-display area NDA2 surrounding the opening area H1 may have different layers in which a plurality of lines SL are disposed. The plurality of lines SL may include a plurality of first data lines, a plurality of second data lines, a plurality of gate lines, and a plurality of emission lines. Accordingly, it is possible to minimize the size of the non-display area NDA2 by vertically arranging the first data lines, the second data lines, the gate lines, and the emission lines in an overlapping manner. For example, the size of the non-display area NDA2 may be decreased to about one third compared to a conventional technology.

As described with reference to FIG. 3, the plurality of data lines, the plurality of gate lines, and the plurality of emission lines may be formed with a curvature along the opening area H1. Accordingly, in the section taken along A-A' of FIG. 3, the plurality of data lines, the plurality of gate lines, and the plurality of emission lines of the non-display area NDA2 may extend in the same direction.

Therefore, the display area DA may be disposed outside the non-display area NDA2. The display area DA may include a plurality of pixels defined by the data lines and the gate lines.

Figure 5:
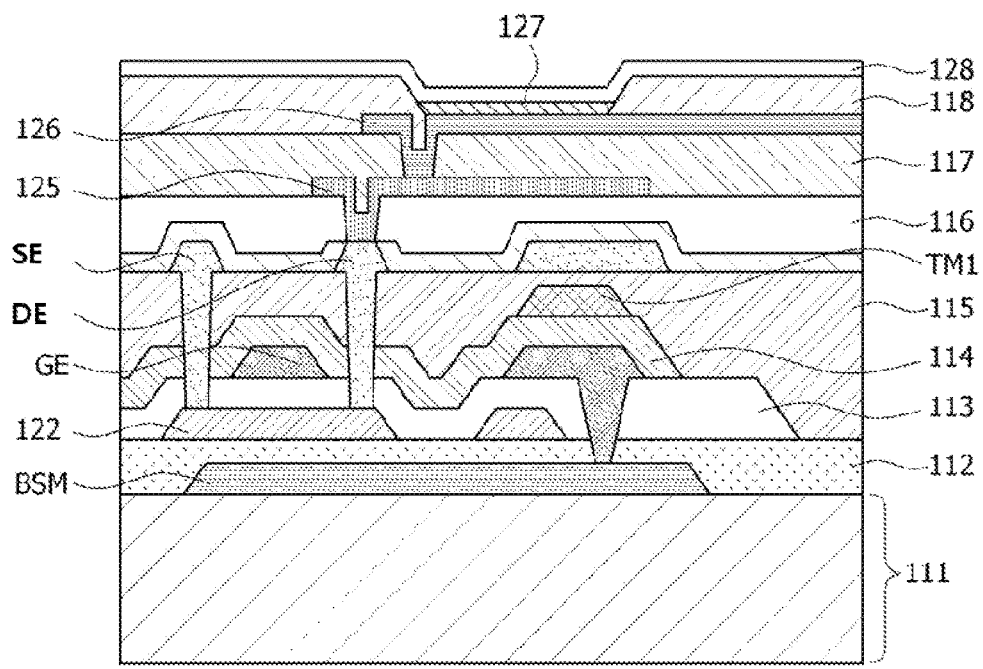
FIG. 5 is a cross-sectional view of a transistor disposed in a pixel.

FIG. 5 is a cross-sectional view of a transistor disposed in a pixel.

Referring to FIG. 5, a base substrate 111 may include a polyimide layer (not shown) and a buffer layer (not shown). The buffer layer may be silicon oxide (SiOx), silicon nitride (SiNx), or a multi-layer thereof. The base substrate 111 may include an opening area formed in the display area and a non-display area surrounding the opening area.

A beam shielding member BSM may be disposed on the base substrate 111. A polyimide-based insulating film forms mobile charges, thereby affecting the semiconductor layer of the transistor and decreasing driving current.

The beam shielding member BSM may serve to prevent the amount of current of a semiconductor layer 122 from being reduced due to the flow of charges in the polyimide layer. The beam shielding member BSM may be in a floating state or may be connected to a gate electrode GE as shown in the drawing. Although this specification shows an aspect in which the beam shielding member BSM is connected to the gate electrode GE, the present disclosure is not limited thereto, and the beam shielding member BSM may be connected to a drain electrode DE. Also, the beam shielding member BSM may be connected to another constant voltage source having a constant voltage level.

A first insulating layer 112 may be disposed on the beam shielding member BSM. The first insulating layer 112 may serve to protect a thin-film transistor formed in a subsequent process from impurities such as alkali ions flowing out of the beam shielding member BSM. The first insulating layer 112 may be silicon oxide (SiOx), silicon nitride (SiNx), or a multi-layer thereof, but the present disclosure is not limited thereto.

The semiconductor layer 122 may be disposed on the first insulating layer 112. The semiconductor layer 122 may be made of a silicon semiconductor or an oxide semiconductor. The silicon semiconductor may include amorphous silicon or crystallized polycrystalline silicon. Here, polycrystalline silicon has high mobility (over 100 $cm^2/Vs$), low energy consumption, and excellent reliability, and thus may be applied to multiplexers (MUX) and/or gate drivers for driver devices or may be applied to in-pixel driving TFTs. Meanwhile, the oxide semiconductor has a low off-current and thus is suitable for a switching TFT having a short on-time and a long off-time. Also, a pixel has a long voltage holding period because of the low off-current, and thus the oxide semiconductor is suitable for a display device requiring low-speed driving and/or low power consumption.

A second insulating layer 113 may be disposed on the semiconductor layer 122. The second insulating layer 113 may be a gate insulating film. The second insulating layer 113 may be silicon oxide (SiOx), silicon nitride (SiNx), or a multi-layer thereof.

The gate electrode GE may be disposed on the second insulating layer 113 above a certain area of the semiconductor layer 122, that is, at a location corresponding to a channel when impurities are implanted.

The gate electrode GE may be formed of one selected from the group consisting of molybdenum (Mo), aluminum (Al), chromium (Cr), gold (Au), titanium (Ti), nickel (Ni), neodymium (Nd), and copper (Cu) or an alloy thereof. Also, the gate electrode GE may be a multi-layer formed of one selected from the group consisting of molybdenum (Mo), aluminum (Al), chromium (Cr), gold (Au), titanium (Ti), nickel (Ni), neodymium (Nd), and copper (Cu) or an alloy thereof. For example, the gate electrode GE may be a double layer of molybdenum and aluminum-neodymium or of molybdenum and aluminum.

A third insulating layer 114 for insulating the gate electrode GE may be disposed on the gate electrode GE. The third insulating layer 114 may be a silicon oxide film (SiOx), a silicon nitride film (SiNx), or a multi-layer thereof.

A capacitor metal layer TM1 may be disposed on the third insulating layer 114. The capacitor metal layer TM1 may face the gate electrode GE with the third insulating layer 114 therebetween and may form a storage capacitor.

A fourth insulating layer 115 may be disposed on the capacitor metal layer TM1. The fourth insulating layer 115 may be a silicon oxide film (SiOx), a silicon nitride film (SiNx), or a multi-layer thereof.

A drain electrode DE and a source electrode SE may be disposed on the fourth insulating layer 115. The source electrode SE may be connected to the semiconductor layer 122 through a contact hole, and the drain electrode DE may be connected to the semiconductor layer 122 through a contact hole.

The source electrode SE and the drain electrode DE may include a single layer or multiple layers. When the source electrode SE and the drain electrode DE include a single layer, the source electrode SE and the drain electrode DE may be formed of one selected from the group consisting of molybdenum (Mo), aluminum (Al), chromium (Cr), gold (Au), titanium (Ti), nickel (Ni), neodymium (Nd), and copper (Cu) or an alloy thereof.

The semiconductor layer 122, the gate electrode GE, the drain electrode DE, and the source electrode SE may constitute a driving transistor.

A fifth insulating layer 116 may be disposed on the source electrode SE and the drain electrode DE. The fifth insulating layer 116 may protect the driving transistor and a transistor disposed in the display area and may decrease a difference in height in the display area DA. A second drain electrode 125 may be disposed on the fifth insulating layer 116, and then a sixth insulating layer 117 may be disposed thereon.

A pixel electrode 126 of an organic light-emitting diode 127 may be disposed on the sixth insulating layer 117. The pixel electrode 126 may be connected to the second drain electrode 125 of the driving transistor DT through a via hole. The pixel electrode 126 may be made of a transparent conductive material such as indium tin oxide (ITO), indium zinc oxide (IZO), or zinc oxide (ZnO), but the present disclosure is not limited thereto.

A bank layer 118 partitioning a pixel may be disposed on the pixel electrode 126. The bank layer 118 may be made of an organic material such as polyimide, benzocyclobutene series resin, and acrylate. A common electrode 128 may be disposed above the bank layer 118.

Figure 6:
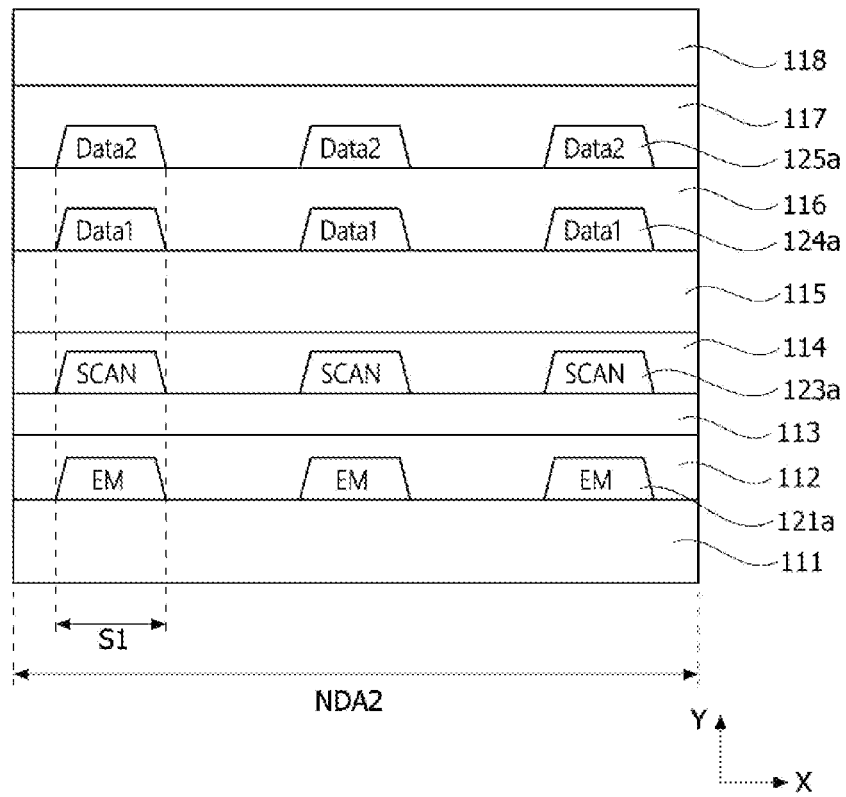
FIG. 6 is a diagram showing the arrangement of lines in a non-display area.
Figure 7:
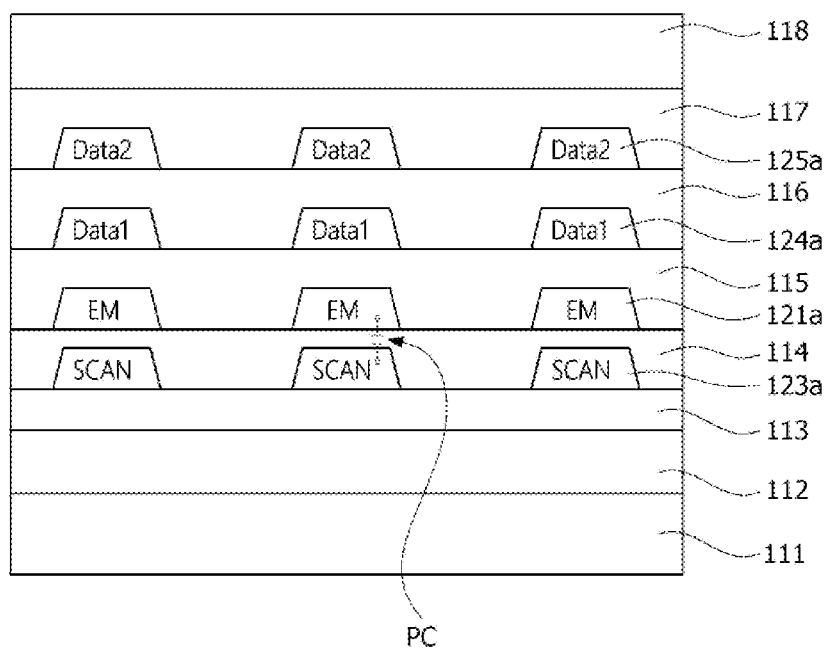
FIG. 7 is a diagram showing parasitic capacitance formed between lines in a non-display area.
Figure 8:
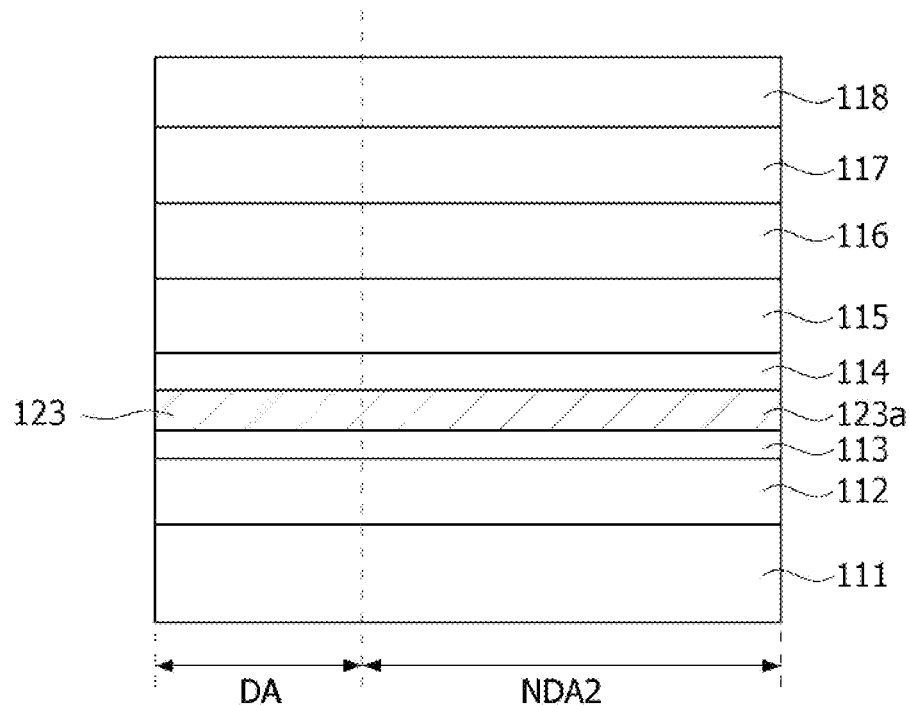
FIG. 8 is a diagram showing a structure in which a gate line of a display area extends to a non-display area.
Figure 9:
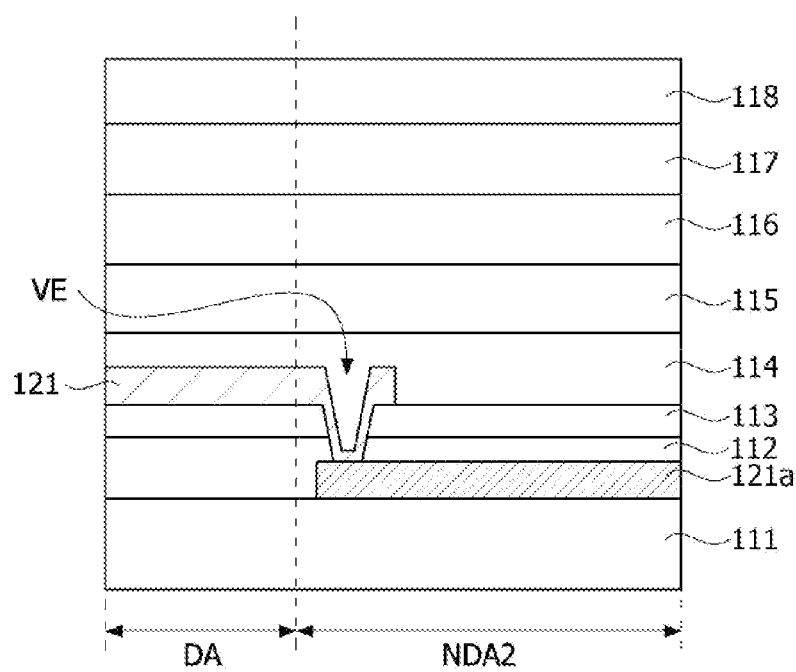
FIG. 9 is a diagram showing a structure in which an emission line of a display area is electrically connected to a connection member of a non-display area.
Figure 10:
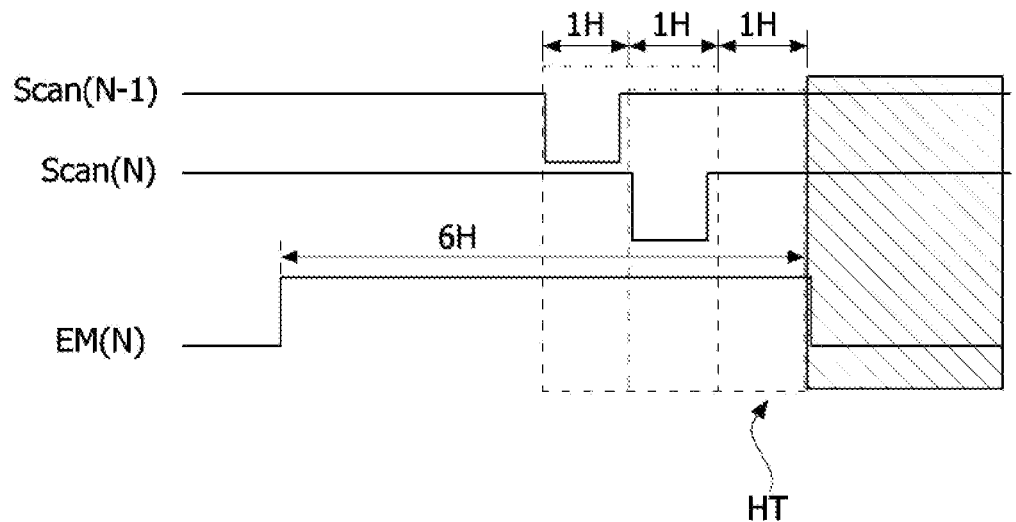
FIG. 10 is a waveform diagram of driving signals of a pixel.

FIG. 6 is a diagram showing the arrangement of lines in a non-display area, FIG. 7 is a diagram showing parasitic capacitance formed between lines in a non-display area, FIG. 8 is a diagram showing a structure in which a gate line of a display area extends to a non-display area, FIG. 9 is a diagram showing a structure in which an emission line of a display area is electrically connected to a connection member of a non-display area, and FIG. 10 is a waveform diagram of driving signals of a pixel.

Referring to FIG. 6, a first emission line 121a may be disposed on a base substrate 111 in a non-display area NDA2, a gate line 123a may be disposed on a second insulating layer 113, a first data line 124a may be disposed on a fourth insulating layer 115, and a second data line 125a may be disposed on a fifth insulating layer 116.

According to an aspect, the size of the non-display area NDA2 may be reduced by placing the gate line 123a for supplying a scan signal and the first emission line 121a for supplying an emission signal in different layers. In this case, it is possible to minimize the size of the non-display area NDA2 by vertically overlapping the first data line 124a, the second data line 125a, the gate line 123a, and the first emission line 121a.

The overlapping may include not only the complete vertical overlapping of the first data line 124a, the second data line 125a, the gate line 123a, and the first emission line 121a but also a partial overlapping thereof. For example, a width S1 by which the gate line 123a and the first emission line 121a overlap vertically (in the y-axis direction) may be greater than 50% of the width of the first emission line 121a. When the width S1 by which the gate line 123a and the first emission line 121a overlap is smaller than 50% of the width of the first emission line 121a, the parasitic capacitance may not decrease significantly, and the size of the non-display area may increase. Here, the width may be a width in a direction (the x-axis direction) which is perpendicular to the length direction of the line.

The first insulating layer 112 is an active buffer layer and has a thickness of about 3000 Å, and the second insulating layer 113 is a gate insulating layer and has a thickness of about 1400 Å. Therefore, an insulating layer with a thickness of about 4400 Å is formed between the gate line 123a and the first emission line 121a, and thus the parasitic capacitance may be reduced.

According to an aspect, the first emission line 121a may be disposed on the bottom in the non-display area NDA2. In the non-display area NDA2, the first emission line 121a may be a dummy pattern of a beam shielding member. That is, while a beam shield member is being formed in the display area, a dummy pattern may be formed in the non-display area NDA2, and the dummy pattern may be electrically connected to the emission line of the display area. Accordingly, the first emission line 121a of the non-display area NDA2 may have the same material and thickness as the beam shielding member of the display area.

Referring to FIG. 7, when the first emission line 121a is disposed above the third insulating layer 114 on which a capacitor metal layer is disposed, the thickness of the third insulating layer 114 is 1400 Å, and thus parasitic capacitance PC relatively increases. Accordingly, a load may increase, which may cause dim-type bad pixels.

On the other hand, referring to FIG. 6, a relatively thick insulating layer is between the gate line 123a and the first emission line 121a, and thus the parasitic capacitance may be relatively small. For example, when the insulating layer between the gate line 123a and the first emission line 121a has a thickness of about 3000 Å or greater, resistor-capacitor (RC) delay may be decreased by relatively lowering the parasitic capacitance.

According to an aspect, the location of the first emission line 121a may be adjusted in the non-display area NDA2 such that the parasitic capacitance between the gate line 123a and the first emission line 121a is minimized. For example, in the non-display area NDA2, the first emission line 121a may be disposed in a layer where the parasitic capacitance between the gate line 123a and the first emission line 121a is smallest. In this case, the first emission line 121a may be disposed at an optimal location in overall consideration of not only the parasitic capacitance between the gate line 123a and the first emission line 121a but also the parasitic capacitance between the first emission line 121a and the data lines 124a and 125a.

Referring to FIG. 8, the gate line 123a of the non-display area NDA2 may be disposed in the same layer as the gate line 123 of the display area DA. On the other hand, the first emission line 121a of the non-display area NDA2 and the emission line 121 of the display area DA may be disposed in different layers, as shown in FIG. 9. As described above, the emission line 121 of the display area DA may be electrically connected to the first emission line 121a, which is a dummy pattern of the beam shielding member. Thus, the first emission line 121a of the non-display area NDA2 may be a connection member connecting the emission lines 121 of the display area DA. In an aspect, the connection member of the non-display area NDA2 has the same reference numeral as the first emission line of the non-display area NDA2 because the connection member may serve as the emission line.

A via-electrode VE may pass through the first insulating layer 112 and the second insulating layer 113 of the non-display area NDA2 to electrically connect the emission line 121 of the display area DA to the first emission line 121a. The via-electrode VE may be formed by the emission line 121 of the display area DA extending to the non-display area NDA2.

However, the present disclosure is not limited thereto. The first emission line 121a of the non-display area NDA2 may be disposed in the same layer as the emission line 121 of the display area DA while the gate line 123a of the non-display area NDA2 and the gate line 123 of the display area DA are disposed in different layers.

Referring to FIG. 10, the parasitic capacitance between the gate line 123a and the first emission line 121a may be decreased to about one third, and the resistance of the gate line 123a may be maintained. Accordingly, a scan load may be reduced, which allows a quick response.

On the other hand, the resistance of the first emission line 121a may increase by a factor of about three while the parasitic capacitance is decreased to about one third. Thus, the RC delay may have a similar level compared to the conventional technology. However, since the emission signal is turned off during a sampling period and has a holding period HT of 1H, there are sufficient margins for a rising time Tr and a falling time Tf. Accordingly, there is no problem in operation.

Figure 11:
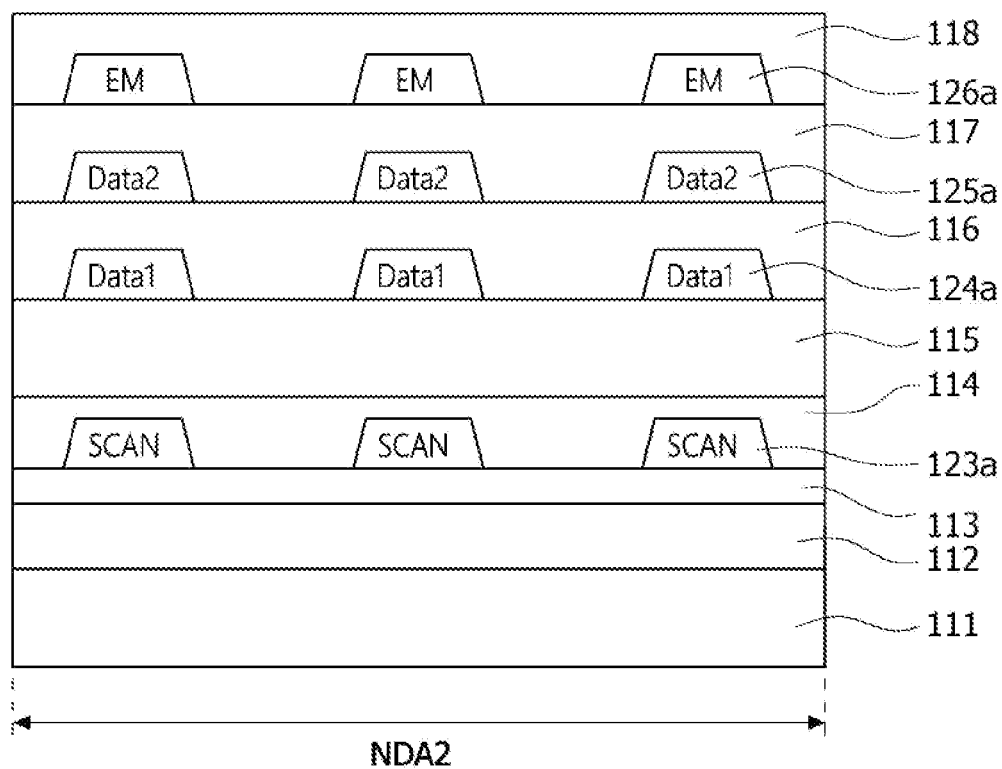
FIG. 11 is a diagram showing the arrangement of lines in a non-display area according to another aspect of the present disclosure.
Figure 12:
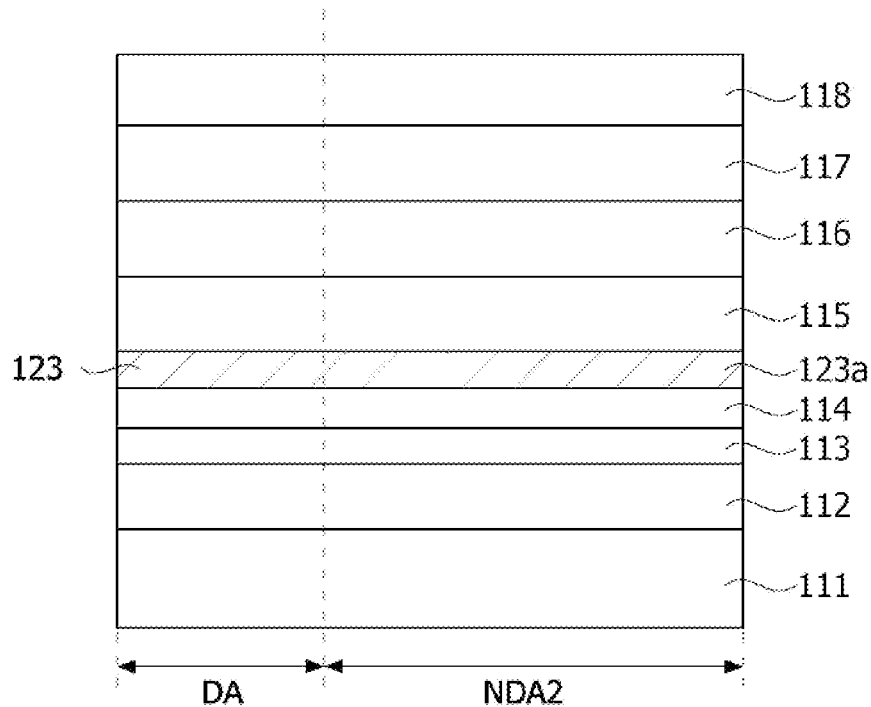
FIG. 12 is a diagram showing a structure in which a gate line of a display area extends to a non-display area.
Figure 13:
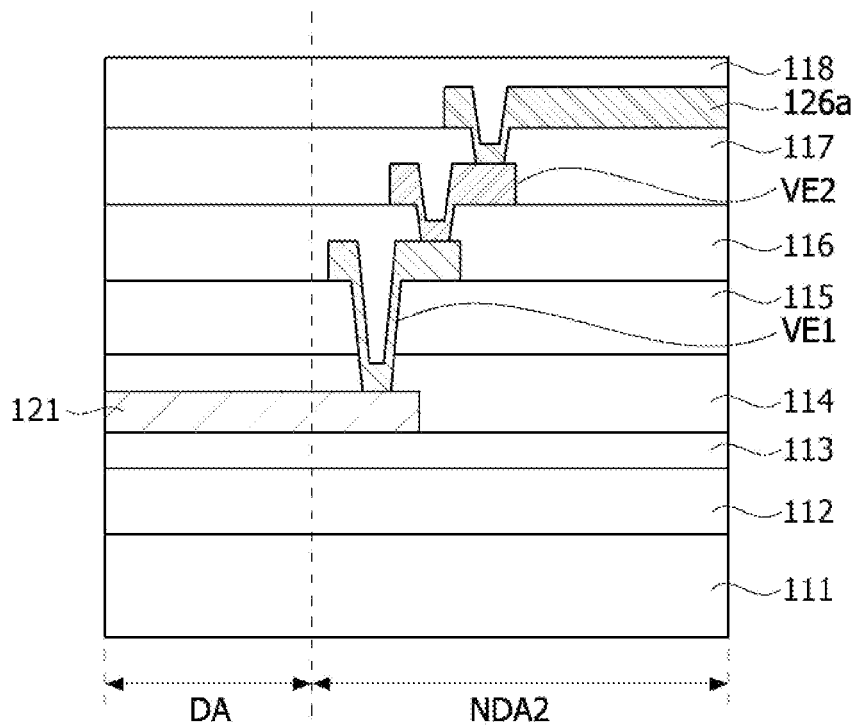
FIG. 13 is a diagram showing a structure in which an emission line of a display area is electrically connected to a connection member of a non-display area.

FIG. 11 is a diagram showing the arrangement of lines in a non-display area according to another aspect of the present disclosure, FIG. 12 is a diagram showing a structure in which a gate line of a display area extends to a non-display area, and FIG. 13 is a diagram showing a structure in which an emission line of a display area is electrically connected to a connection member of a non-display area.

Referring to FIG. 11, in a non-display area NDA2, a second emission line 126a may be disposed on a sixth insulating layer 117, a gate line 123a may be disposed on a second insulating layer 113, a first data line 124a may be disposed on a fourth insulating layer 115, and a second data line 125a may be disposed on a fifth insulating layer 116.

According to an aspect, the size of a bezel area may be reduced by placing the gate line 123a for supplying a scan signal and the second emission line 126a for supplying an emission signal in different layers. In this case, it is possible to minimize the size of the non-display area NDA2 by vertically overlapping the first data line 124a, the second data line 125a, the gate line 123a, and the second emission line 126a.

In this case, the overlapping may include not only the complete vertical overlapping of the first data line 124a, the second data line 125a, the gate line 123a, and the second emission line 126a but also a partial overlapping thereof.

Since the gate line 123a is disposed on the second insulating layer 113 and the second emission line 126a is disposed on the sixth insulating layer 117, parasitic capacitance may not be formed between the gate line 123a and the second emission line 126a. Also, since a sixth insulating layer 117 which is thick and has a thickness of about 2 μm is disposed between the second emission line 126a and the second data line 125a, the parasitic capacitance may be very small.

According to an aspect, the second emission line 126a may be disposed on the top in the non-display area NDA2. In the non-display area NDA2, the second emission line 126a may be a dummy pattern of a pixel electrode. That is, while the pixel electrode is being formed in the display area, a dummy pattern may be formed in the non-display area NDA2, and the dummy pattern may be electrically connected to the emission line 121 of the display area DA. Accordingly, the second emission line 126a of the non-display area NDA2 may have the same material and thickness as the pixel electrode of the display area.

Referring to FIG. 12, the gate line 123a of the non-display area NDA2 may be disposed in the same layer as the gate line 123 in the display area DA. On the other hand, the second emission line 126a of the non-display area NDA2 and the emission line 121 of the display area DA may be disposed in different layers, as shown in FIG. 13. As described above, the emission line 121 in the display area DA may be electrically connected to a second emission line 126a, which is a dummy pattern of the pixel electrode. Thus, the second emission line 126a of the non-display area NDA2 may be a connection member connecting the emission lines 121 of the display area DA.

In the non-display area NDA2, a via-electrode VE may include a first via-electrode VE1 that passes through the third insulating layer 114 and the fourth insulating layer 115 and a second via-electrode VE2 connected to the first via-electrode VE1 through the fifth insulating layer 116. However, the present disclosure is not limited thereto, and one via-electrode may pass through the third to fifth insulating layers 114, 115, and 116.

However, the present disclosure is not limited thereto. The second emission line 126a of the non-display area NDA2 may be disposed in the same layer as the emission line 121 of the display area DA while the gate line 123a of the non-display area NDA2 and the gate line 123 of the display area DA are disposed in different layers and connected to each other.

According to an aspect, it is possible to reduce the size of a bezel area surrounding an opening area.

Also, it is possible to reduce parasitic capacitance generated between lines arranged in a bezel area. Accordingly, it is possible to prevent an image quality defect in the form of dimness.

Also, it is possible to increase a degree of design freedom when designing lines.

Also, it is possible to apply a conventional process without change because a dummy pattern is used.

Various advantageous merits and effects of the present disclosure are not limited to the above-descriptions and will be easily understood while aspects of the present disclosure are described in detail.

While the present disclosure has been described with reference to exemplary aspects, these are just examples and do not limit the present disclosure. It will be understood by those skilled in the art that various modifications and applications may be made therein without departing from the essential characteristics of the aspects. For example, elements described in the aspects above in detail may be modified. Furthermore, differences associated with such modifications and applications should be construed as being included in the scope of the present disclosure defined by the appended claims.

What is claimed is:

1. A display device having a display area and a non-display area surrounding an opening area disposed in the display area, comprising:
   a plurality of pixels and a plurality of lines connected to the plurality of pixels disposed in the display area,
   a connection member disposed in the non-display area and connected to at least one of the plurality of lines of the display area,
   wherein the connection member is disposed in a different layer from the at least one of the plurality of lines of the display area and is electrically connected to the at least one of the plurality of lines by a via-electrode, and
   wherein the via-electrode passes through a plurality of insulating layers in the non-display area to electrically connect the at least one of the plurality of lines to the connection member.

2. The display device of claim 1, wherein the connection member is disposed in a lower layer than the at least one of the plurality of lines.

3. The display device of claim 1, wherein the connection member is disposed in a higher layer than the at least one of the plurality of lines.

4. The display device of claim 1, further comprising a transistor disposed in the plurality of pixels,
   wherein the transistor comprises:
   a beam shielding member disposed on a substrate;
   a semiconductor pattern disposed on the beam shielding member; and
   a gate electrode disposed on the semiconductor pattern,
   wherein the line connected to the connection member among the plurality of lines is a gate line or an emission line, and
   wherein the connection member is disposed in the same layer as the beam shielding member.

5. The display device of claim 4, wherein the plurality of insulating layers comprise a first insulating layer and a second insulating layer,
   wherein the first insulating layer is disposed between the beam shielding member and the semiconductor pattern, and
   wherein the second insulating layer is disposed between the semiconductor pattern and the gate electrode.

6. The display device of claim 5, wherein the connection member is electrically insulated from the beam shielding member, and
   wherein the connection member has same composition and thickness as the beam shielding member.

7. The display device of claim 5, wherein the gate electrode in the display area is electrically connected to the beam shielding member through the first insulating layer and the second insulating layer.

8. The display device of claim 1, wherein the plurality of lines in the non-display area vertically overlap with one another.

9. The display device of claim 1, wherein the at least one of the plurality of lines electrically connected to the connection member includes an emission line.

10. The display device of claim 1, further comprising a transistor disposed in the plurality of pixels,
    wherein the transistor comprises:
    a beam shielding member disposed on a substrate;
    a semiconductor pattern disposed on the beam shielding member;
    a gate electrode disposed on the semiconductor pattern;
    a source electrode and a drain electrode electrically connected to the semiconductor pattern; and
    a pixel electrode disposed on the gate electrode,
    wherein the at least one of the plurality of lines connected to the connection member among the plurality of lines is a gate line or an emission line, and
    wherein the connection member is disposed in a same layer as the pixel electrode.

11. A display device having a display area and a non-display area surrounding an opening area disposed in the display area, comprising:
    a plurality of pixels and a plurality of lines connected to the plurality of pixels disposed in the display area,
    a transistor disposed in the plurality of pixels,
    a connection member disposed in the non-display area and connected to at least one of the plurality of lines of the display area,
    wherein the connection member is disposed in a different layer from the at least one of the plurality of lines of the display area and is electrically connected to the at least one of the plurality of lines by a via-electrode,
    wherein the transistor comprises:
    a beam shielding member disposed on a substrate;
    a semiconductor pattern disposed on the beam shielding member;
    a gate electrode disposed on the semiconductor pattern;
    a source electrode and a drain electrode electrically connected to the semiconductor pattern; and
    a pixel electrode disposed on the gate electrode,
    wherein the at least one of the plurality of lines connected to the connection member among the plurality of lines is a gate line or an emission line, and
    wherein the via-electrode passes through an insulating layer between the gate electrode and the pixel electrode in the non-display area to electrically connect the gate line or the emission line to the connection member.

12. The display device of claim 10, wherein the connection member is electrically insulated from the pixel electrode, and
    wherein the connection member has same composition and thickness as the pixel electrode.

13. A display device comprising:
    a substrate having an opening area disposed in a display area and a non-display area surrounding the opening area;
    a gate line extending through the display area and the non-display area; and
    an emission line disposed in a different layer from the gate line in the non-display area,
    wherein the emission line is disposed at a location where parasitic capacitance between the emission line and the gate line is minimized in the non-display area.

14. The display device of claim 13, wherein the emission line is disposed in a layer in which the parasitic capacitance between the emission line and the gate line is smallest in the non-display area.

15. The display device of claim 13, wherein the emission line is disposed in a same layer as the gate line in the display area.

16. The display device of claim 15, further comprising a via-electrode configured to connect emission lines disposed in different layers in the display area and the non-display area.

17. The display device of claim 13, wherein a width by which the emission line and the gate line overlap with each other in the non-display area is greater than or equal to 50% of a width of the emission line.

18. The display device of claim 17, further comprising an insulating layer disposed between the emission line and the gate line in the non-display area.

19. The display device of claim 17, wherein the insulating layer has a thickness of 3000 Å or greater.

* * * * *